US010083963B2

(12) United States Patent
Goktepeli et al.

(10) Patent No.: US 10,083,963 B2
(45) Date of Patent: Sep. 25, 2018

(54) LOGIC CIRCUIT BLOCK LAYOUTS WITH DUAL-SIDE PROCESSING

(71) Applicant: QUALCOMM Incorporated, San Diego, CA (US)

(72) Inventors: Sinan Goktepeli, San Diego, CA (US); Jean Richaud, Aix en Provence (FR)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/387,501

(22) Filed: Dec. 21, 2016

(65) Prior Publication Data
US 2018/0175034 A1  Jun. 21, 2018

(51) Int. Cl.
| | |
|---|---|
| H01L 27/092 | (2006.01) |
| H01L 21/8238 | (2006.01) |
| H01L 29/06 | (2006.01) |
| H01L 29/423 | (2006.01) |
| H01L 21/768 | (2006.01) |
| H01L 21/822 | (2006.01) |
| H01L 27/06 | (2006.01) |

(52) U.S. Cl.
CPC .... *H01L 27/0924* (2013.01); *H01L 21/76895* (2013.01); *H01L 21/76898* (2013.01); *H01L 21/8221* (2013.01); *H01L 21/823821* (2013.01); *H01L 21/823871* (2013.01); *H01L 21/823878* (2013.01); *H01L 27/0694* (2013.01); *H01L 27/092* (2013.01); *H01L 29/0649* (2013.01); *H01L 29/0676* (2013.01); *H01L 29/42392* (2013.01)

(58) Field of Classification Search
CPC ......... H01L 27/0924; H01L 21/823821; H01L 21/823871; H01L 21/823878; H01L 29/0649; H01L 29/0676; H01L 29/42392
See application file for complete search history.

(56) References Cited

U.S. PATENT DOCUMENTS

| | | | | |
|---|---|---|---|---|
| 6,150,708 | A * | 11/2000 | Gardner | H01L 21/8221 257/446 |
| 7,202,140 | B1 * | 4/2007 | Ang | H01L 21/76256 257/621 |
| 7,235,857 | B2 * | 6/2007 | Majumdar | H01L 21/8213 257/510 |
| 7,491,588 | B2 * | 2/2009 | Campbell | H01L 21/743 257/E21.544 |
| 8,018,031 | B2 | 9/2011 | Yanagida | |
| 8,058,137 | B1 | 11/2011 | Or-Bach et al. | |
| 8,525,253 | B2 | 9/2013 | Micciche' et al. | |

(Continued)

OTHER PUBLICATIONS

International Search Report and Written Opinion—PCT/US2017/058315—ISA/EPO—dated Jan. 18, 2018.

*Primary Examiner* — Mark Tornow
(74) *Attorney, Agent, or Firm* — Seyfarth Shaw LLP

(57) ABSTRACT

An integrated circuit device may include a p-type metal oxide semiconductor (PMOS) transistor supported by a backside of an isolation layer. The integrated circuit device may also include an n-type metal oxide semiconductor (NMOS) transistor supported by a front-side of the isolation layer, opposite the backside. The integrated circuit device may further include a shared contact extending through the isolation layer and electrically coupling a first terminal of the PMOS transistor to the first terminal of the NMOS transistor.

16 Claims, 14 Drawing Sheets

(56) References Cited

U.S. PATENT DOCUMENTS

| | | |
|---|---|---|
| 9,053,964 B2 | 6/2015 | Jeon et al. |
| 2002/0047143 A1* | 4/2002 | Ramdani ................. C30B 25/18 |
| | | 257/289 |
| 2007/0267723 A1* | 11/2007 | Bernstein ............. H01L 23/481 |
| | | 257/621 |
| 2013/0029614 A1 | 1/2013 | Cho et al. |
| 2014/0091366 A1* | 4/2014 | Jeon .................... H01L 21/8252 |
| | | 257/195 |
| 2014/0327077 A1* | 11/2014 | Stuber ................. H01L 23/481 |
| | | 257/347 |
| 2015/0048420 A1 | 2/2015 | Léomant et al. |
| 2016/0336421 A1 | 11/2016 | Cheng et al. |

\* cited by examiner

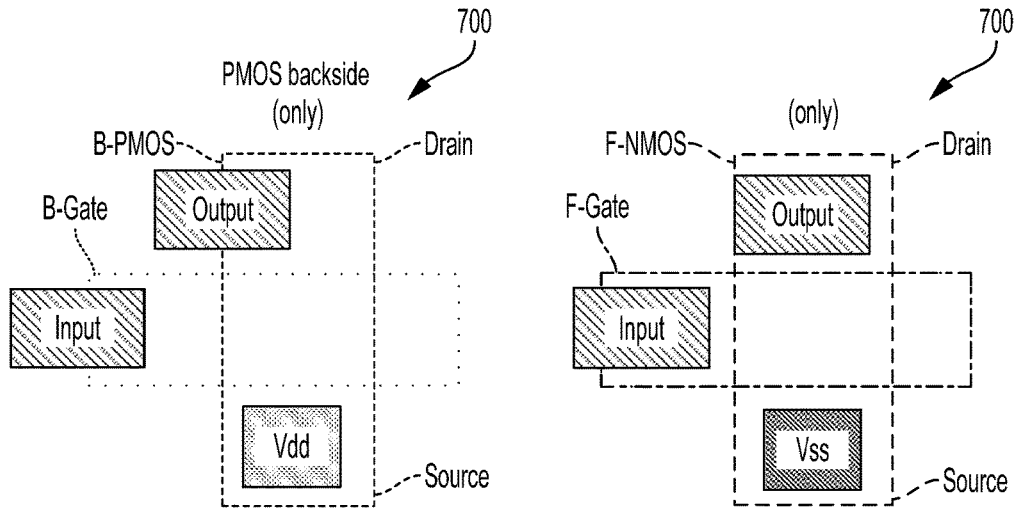
FIG. 7A
(backside view 702)
FIG. 7B
(side view 704)
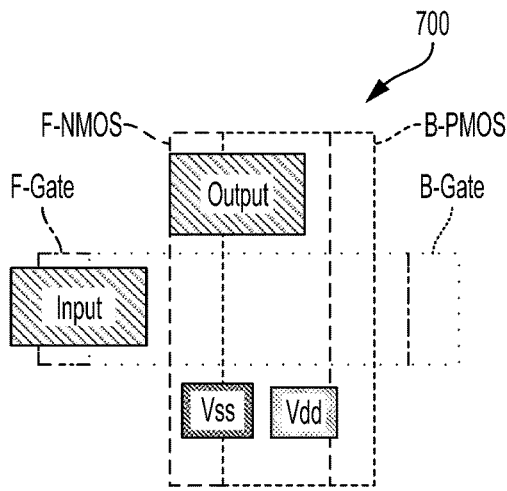
FIG. 7C
(combined view 706)
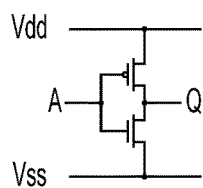
FIG. 7D

LOGIC CIRCUIT BLOCK LAYOUTS WITH DUAL-SIDE PROCESSING

TECHNICAL FIELD

The present disclosure generally relates to integrated circuits (ICs). More specifically, the present disclosure relates to logic circuit block layouts with dual-sided processing.

BACKGROUND

Mobile radio frequency (RF) chip designs (e.g., mobile RF transceivers), including high performance diplexers, have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, such as mismatch, noise and other performance considerations. The design of these mobile RF transceivers includes the use of additional passive devices, for example, to suppress resonance, and/or to perform filtering, bypassing and coupling.

The design of these mobile RF transceivers may include the use of silicon on insulator (SOI) technology. SOI technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of an active device on the silicon layer and a substrate supporting the BOX layer.

The active devices on the SOI layer may include complementary metal oxide semiconductor (CMOS) transistors. The process flow for semiconductor fabrication of CMOS transistors is generally performed during front-end-of-line (FEOL) processes. The front-end-of-line processes may include the set of process steps that form the active devices (e.g., transistors). The FEOL processes include ion implantation, anneals, oxidation, chemical vapor deposition (CVD) or atomic layer deposition (ALD), etching, chemical mechanical polishing (CMP), epitaxy. Unfortunately, these FEOL processes are generally limited to CMOS transistor formation on one side of a semiconductor wafer.

SUMMARY

An integrated circuit device may include a p-type metal oxide semiconductor (PMOS) transistor supported by a backside of an isolation layer. The integrated circuit device may also include an n-type metal oxide semiconductor (NMOS) transistor supported by a front-side of the isolation layer, opposite the backside. The integrated circuit device may further include a shared contact extending through the isolation layer and electrically coupling a first terminal of the PMOS transistor to the first terminal of the NMOS transistor.

An integrated circuit device may include a pair of first polarity transistors on a front-side of an isolation layer. The pair of first polarity transistors may be electrically coupled in parallel. The integrated circuit device may also include a pair of second polarity transistors on a backside of the isolation layer, opposite the front-side. The pair of second polarity transistors electrically may be coupled in series. The integrated circuit device may further include a first shared contact coupled to a gate of the first transistor of the pair of first polarity transistors and the gate of the first transistor of the pair of second polarity transistors. The integrated circuit device may also include a second shared contact coupled to the gate of the second transistor of the pair of first polarity transistors and the gate of the second transistor of the pair of second polarity transistors. The integrated circuit device may further include a first voltage contact coupled to a first terminal of each of the pair of first polarity transistors. The integrated circuit device may also include a second voltage contact coupled to the first terminal of one of the pair of second polarity transistors. The integrated circuit device may further include an output contact coupled to a second terminal of the other of the pair of second polarity transistors and also coupled to the second terminal of both of the pair of first polarity transistors.

A method of constructing an integrated circuit device may include fabricating an n-type metal oxide semiconductor (NMOS) transistor on a front-side surface of an isolation layer. The method may also include bonding a handle substrate to a front-side dielectric layer on the NMOS transistor. The method may further include fabricating a p-type metal oxide semiconductor (PMOS) transistor on a backside surface of the isolation layer, the PMOS transistor arranged in a staggered arrangement relative to the NMOS transistor. The method may also include fabricating a shared contact extending through the isolation layer and electrically coupling a first terminal of the PMOS transistor to the first terminal of the NMOS transistor. The method may further include coupling a power supply rail (Vdd) to a second terminal of the PMOS transistor. The method may also include coupling a ground rail (Vss) to the second terminal of the NMOS transistor.

A radio frequency (RF) front end module may include an integrated RF circuit structure. The integrated RF circuit structure may include a p-type metal oxide semiconductor (PMOS) transistor supported by a backside of an isolation layer. The integrated RF circuit structure may also include an n-type metal oxide semiconductor (NMOS) transistor supported by a front-side of the isolation layer. The integrated RF circuit structure may further include a shared contact extending through the isolation layer and electrically coupling a first terminal of the PMOS transistor to the first terminal of the NMOS transistor. The RF front end module may also include an antenna coupled to an output of the integrated RF circuit structure.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 7A-7C illustrate dual-sided, logic gate layouts according to aspects of the present disclosure.

FIG. 7D illustrates a circuit representation of the dual-sided, logic gate layouts shown in FIGS. 7A-C according to aspects of the present disclosure.

DETAILED DESCRIPTION

Figure 1A:
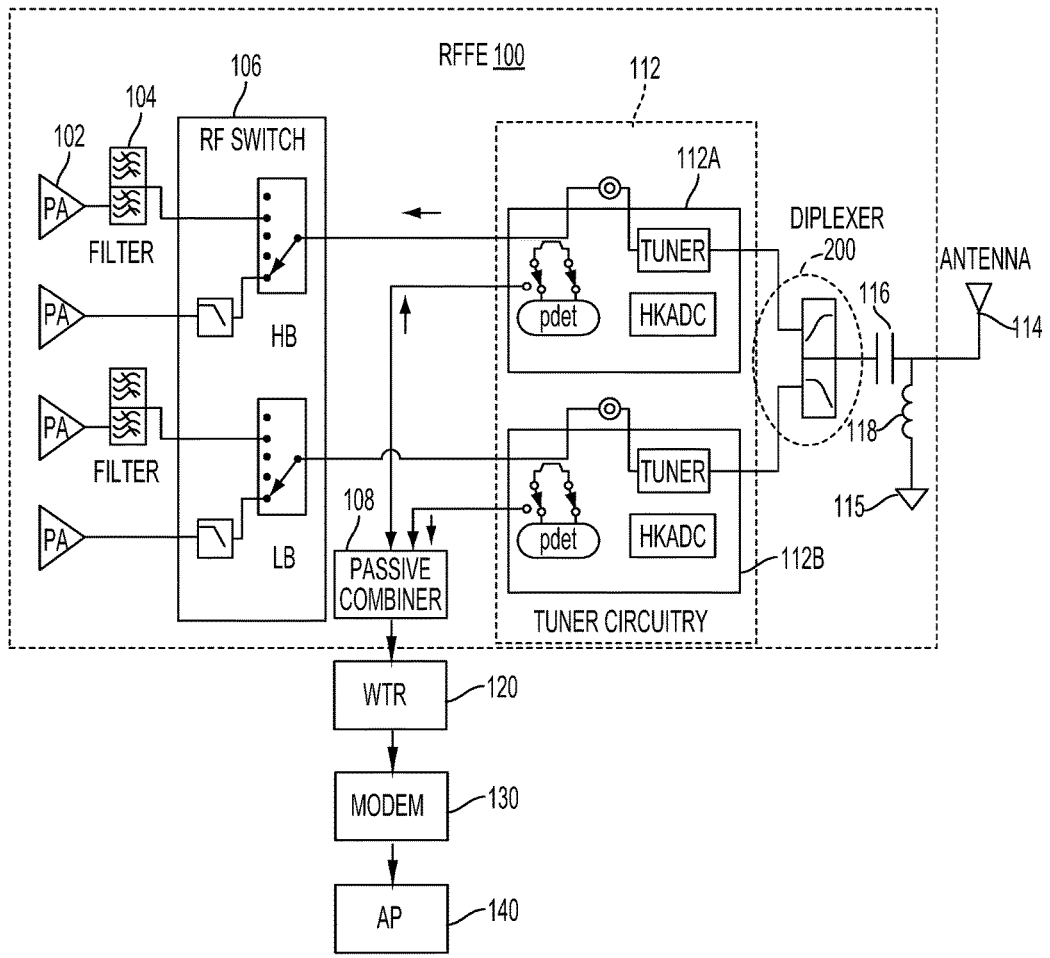
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation.

Successful fabrication of modern semiconductor chip products involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.). The front-end-of-line processes may include the set of process steps that form the active devices, such as transistors, capacitors, diodes. The front-end-of-line processes include ion implantation, anneals, oxidation, chemical vapor deposition (CVD) or atomic layer deposition (ALD), etching, chemical mechanical polishing (CMP), epitaxy. The middle-of-line processes may include the set of process steps that enable connection of the transistors to BEOL interconnect. These steps include silicidation and contact formation as well as stress introduction. The back-end-of-line processes may include the set of process steps that form the interconnect that ties the independent transistors and form circuits. Currently, copper and aluminum provide the interconnects, but with further development of the technology other conductive material may be used.

The design of these mobile RF transceivers may include the use of silicon on insulator (SOI) technology. SOI technology replaces conventional silicon substrates with layered silicon-insulator-silicon substrates to reduce parasitic device capacitance and improve performance. SOI-based devices differ from conventional, silicon-built devices because the silicon junction is above an electrical isolator, typically a buried oxide (BOX) layer, in which a thickness of the BOX layer may be reduced.

The active devices on the SOI layer may include complementary metal oxide semiconductor (CMOS) transistors. The process flow for semiconductor fabrication of CMOS transistors is generally performed during front-end-of-line (FEOL) processes. The front-end-of-line processes may include the set of process steps that form the active devices (e.g., transistors). The FEOL processes include ion implantation, anneals, oxidation, chemical vapor deposition (CVD) or atomic layer deposition (ALD), etching, chemical mechanical polishing (CMP), epitaxy. Unfortunately, these FEOL processes are generally limited to CMOS transistor formation on one side of a semiconductor wafer. That is, conventional CMOS transistor fabrication technology is limited to transistor fabrication on a front-side of the semiconductor, which limits transistor density. As a result, aspects of the present disclosure include a post-layer transfer process to enable logic circuit layouts with dual-sided processing.

Various aspects of the disclosure provide techniques of forming logic circuit layouts within an integrated circuit structure that are fabricated using dual-sided processing. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes. The middle-of-line processes may include the set of process steps that enable connection of the transistors to BEOL interconnects. These steps include silicidation and contact formation as well as stress introduction. The back-end-of-line processes may include the set of process steps that form the interconnect that ties the independent transistors and form circuits. Currently, copper and aluminum are materials to form the interconnects, but with further development of the technology other conductive material may be used.

Various aspects of the disclosure provide techniques for forming devices on multiple sides of an isolation layer (e.g., a buried oxide or BOX layer). According to a first method, a first set of devices (e.g., semiconductor devices) may be formed on a front-side of the isolation layer, where the isolation layer is positioned above an etch enhancer layer. In some implementations, the isolation layer may be a high K dielectric layer. A dielectric layer (e.g., insulator) may be deposited on and around the first set of devices, and a handle wafer may be attached to the dielectric layer (e.g., the handle may be used to manipulate a die including the isolation layer during fabrication, such as to flip the die over). Next, an etching process may be performed to expose the etch enhancement layer, where the etching process is performed from a backside of the isolation layer that is opposite the front-side. As used herein, an etching process may refer to a wet etching process or to a dry etching process. A planarization process (e.g., chemical mechanical planarization (CMP)) may be performed to remove the etch enhancement layer, after which a second set of devices may be formed on the backside of the isolation layer.

Although aspects of the present disclosure are described with respect to silicon on insulator (SOI) technology, the aspects of the disclosure can also be implemented using other fabrication technologies for a planar transistor, a fin-type field effect transistor (FinFET), a nanotube, a bulk silicon alternative to the silicon-on-insulator technology, or other like semiconductor fabrication technology. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

To simplify the processing of semiconductor devices on dual sides (opposite sides) of an isolation layer, a first set of devices that are similar (e.g., same polarity) are placed on one side of the isolation layer, while a second set of devices that are different from the first set of devices are placed on a second side (e.g., opposite side) of the isolation layer. For example, only n-type metal oxide semiconductor (NMOS) devices are placed on one side of the isolation layer and only p-type metal oxide semiconductor (PMOS) devices are placed on an opposite side of the isolation layer. In some implementations, only thick devices are placed on one side of the isolation layer and only thin devices are placed on an opposite side of the isolation layer. Thus, after placing the NMOS devices on the same side of the isolation layer, no PMOS device related masks or processes are introduced to accommodate PMOS devices that are not on this side of the isolation layer. The resulting device (e.g., integrated circuit device) is then flipped and the PMOS devices are placed on the flipped side (which is opposite the side on which the NMOS devices are placed). In this case, after placing the PMOS devices on the flipped side of the isolation layer, no NMOS device related masks or processes have to be introduced to accommodate NMOS devices that are not on this side of the isolation layer.

The arrangement of the same or similar devices on the same side of the isolation layer and different devices on a different side of the isolation layer reduces a size (e.g., by 30%) of the die of the semiconductor devices (e.g., transistors) and consequently the size of the resulting device (e.g., having only semiconductor devices of a first polarity on one side of the isolation layer and having only semiconductor devices of a different polarity on an opposite side of the isolation layer). The number of masks also heavily impacts a unit price of the resulting device. Thus, the reduction in the number of masks due to the noted device arrangement causes a reduction in the price of the resulting device. Further, eliminating some of the device related masks and process steps reduces processing time (e.g., by up to seven days). Aspects of the present disclosure eliminate multiple process steps and their corresponding etch/deposition/anneal that reduces processing time (e.g., by up to thirteen days). Layer transfer steps are also reduced, which causes a corresponding reduction in processing time (e.g., 4-5 days).

One aspect of the present disclosure uses shared contacts between the backside source/drain contacts and the front-side source/drain regions of the resulting device (e.g., having only semiconductor devices (e.g., transistors) of a first polarity on one side of the isolation layer and having only semiconductor devices of a different polarity on an opposite side of the isolation layer). In addition, contacts may be shared between the backside gates and the front-side gates of the resulting device.

Aspects of the present disclosure further describe dual-sided, logic circuit block layouts that may be used in integrated radio frequency (RF) circuit structures for high quality (Q)-factor RF applications. The noted dual-sided processing enables formation of dual-sided, logic gates, resulting in up to 60% area savings. In one configuration, a pre-layer transfer process forms front-side transistors. In addition, a post-layer transfer process forms backside transistors. The post-layer transfer process may also form fin-type field effect transistors (FinFETs). By arranging the front-side transistors and the backside transistors according to polarity and electrically coupling these active devices, dual-sided, logic gates are formed with up to a 60% area savings.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
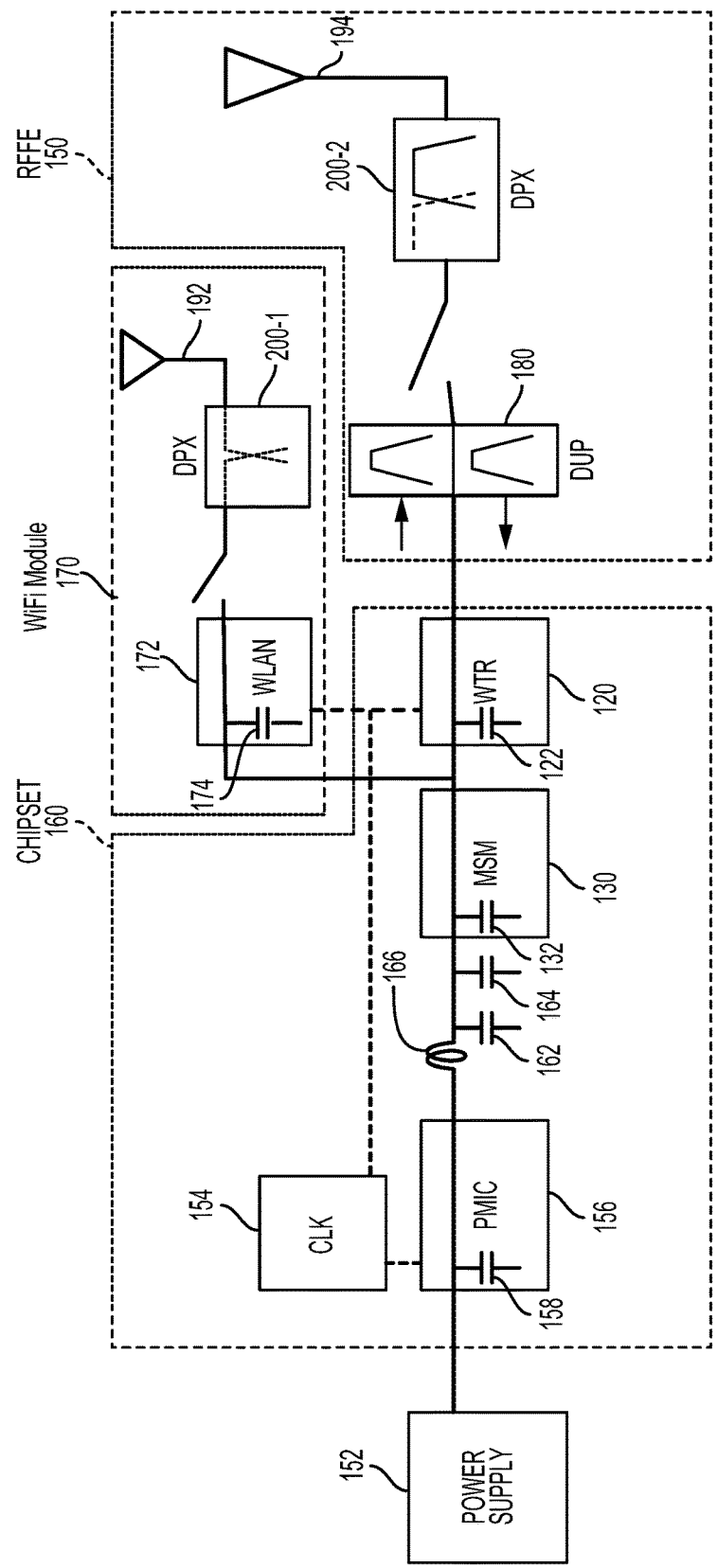
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
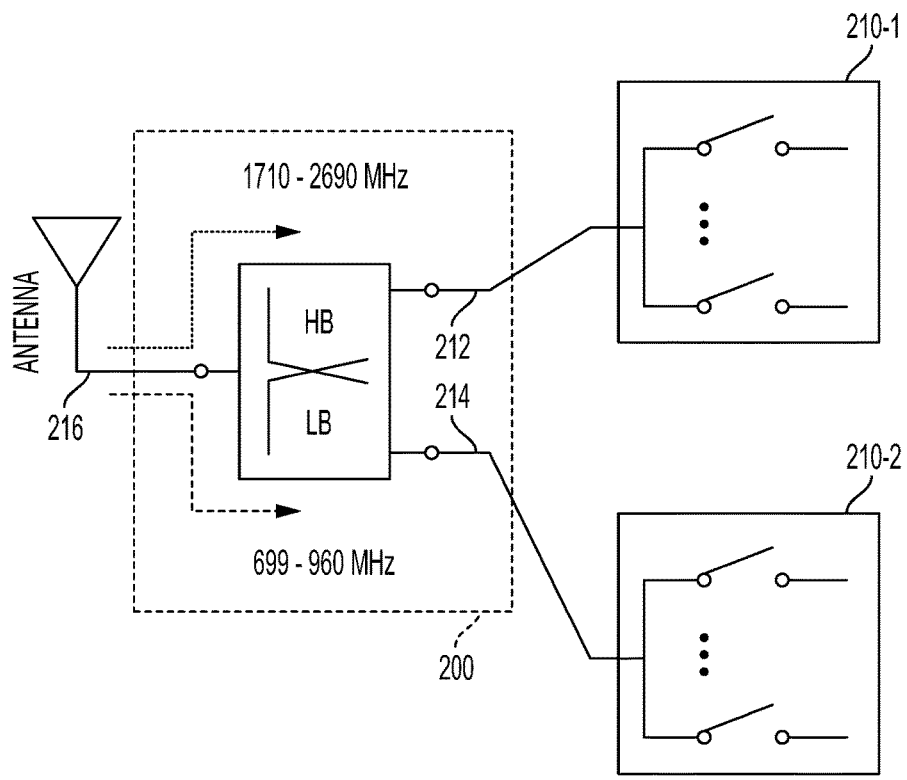
FIG. 2A is a diagram of a diplexer design according to an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
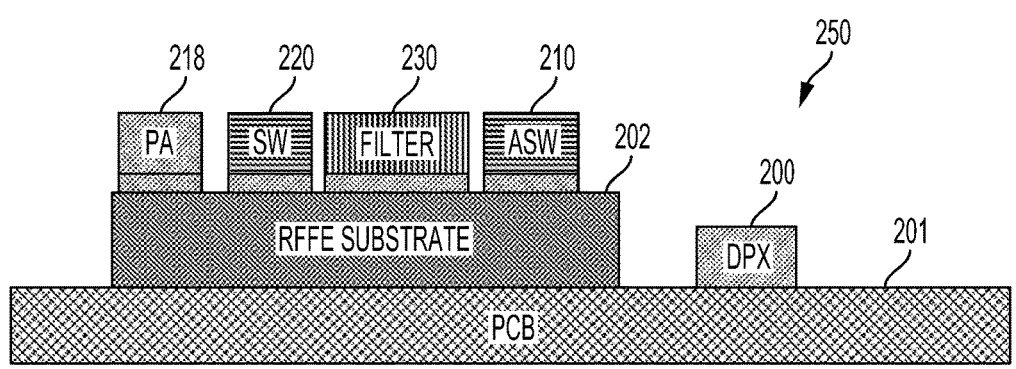
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this configuration, the RF front end module 250 is implemented using silicon on insulator (SOI) technology, which helps reduce high order harmonics in the RF front end module 250. SOI technology replaces conventional silicon substrates with a layered silicon-insulator-silicon substrate to reduce parasitic device capacitance and improve performance. SOI-based devices differ from conventional silicon-built devices because the silicon junction is above an electrical insulator, typically a buried oxide (BOX) layer. A reduced thickness BOX layer, however, may not sufficiently reduce the parasitic capacitance caused by the proximity between an active device (on the silicon layer) and a substrate supporting the BOX layer. As a result, the present disclosure employs a layer transfer process to further separate the active device from the substrate, as shown in FIGS. 3A to 3E.

Figure 3A:
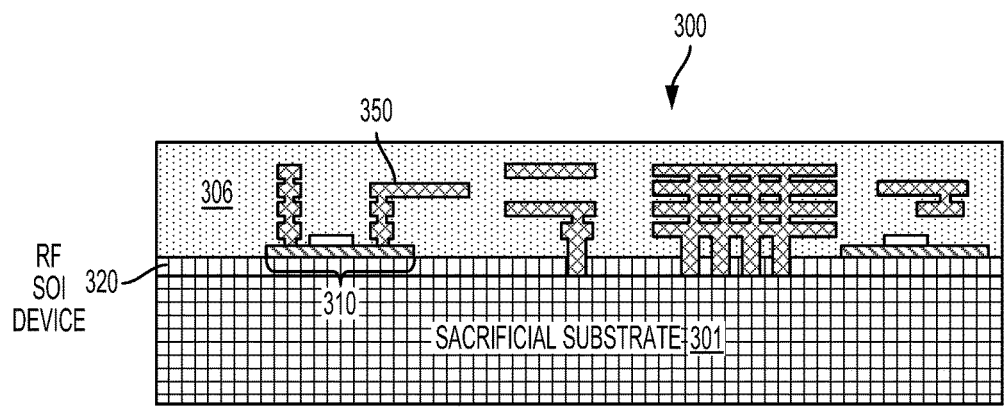
FIGS. 3A to 3E show cross-sectional views of an integrated radio frequency (RF) circuit structure during a layer transfer process according to aspects of the present disclosure.
Figure 3B:
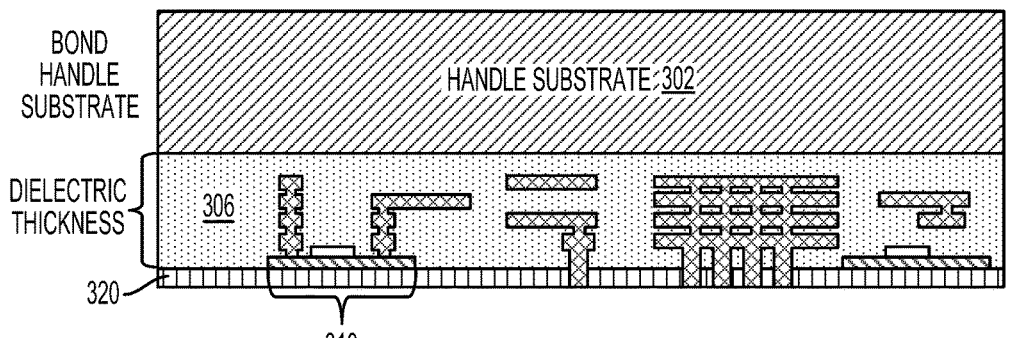

FIGS. 3A to 3E show cross-sectional views of an integrated radio frequency (RF) circuit structure 300 during a layer transfer process according to aspects of the present disclosure. As shown in FIG. 3A, an RF silicon on insulator (SOI) device includes an active device 310 on a buried oxide (BOX) layer 320 supported by a sacrificial substrate 301 (e.g., a bulk wafer). The RF SOI device also includes interconnects 350 coupled to the active device 310 within a first dielectric layer 306. As shown in FIG. 3B, a handle substrate 302 is bonded to the first dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the active device 310 and the handle substrate 302.

Figure 3C:
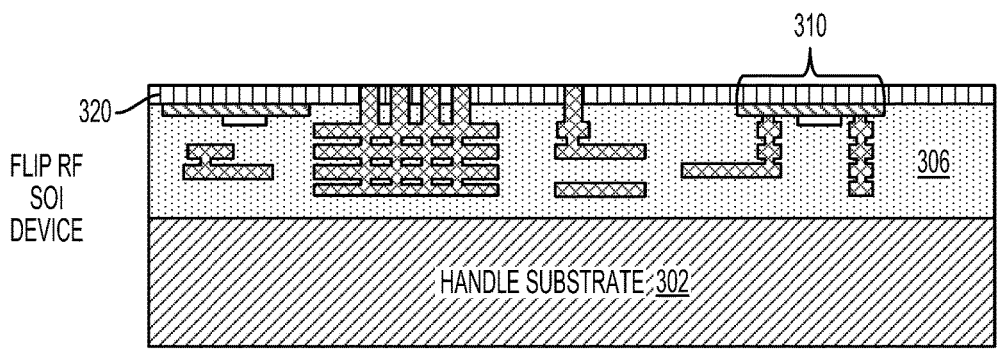
Figure 3D:
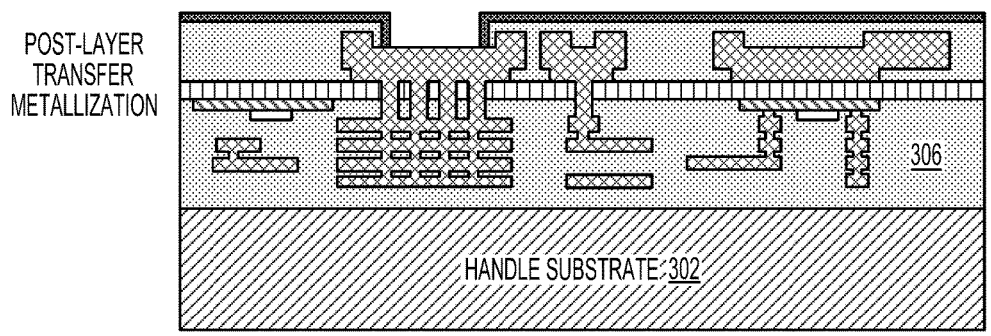
Figure 3E:
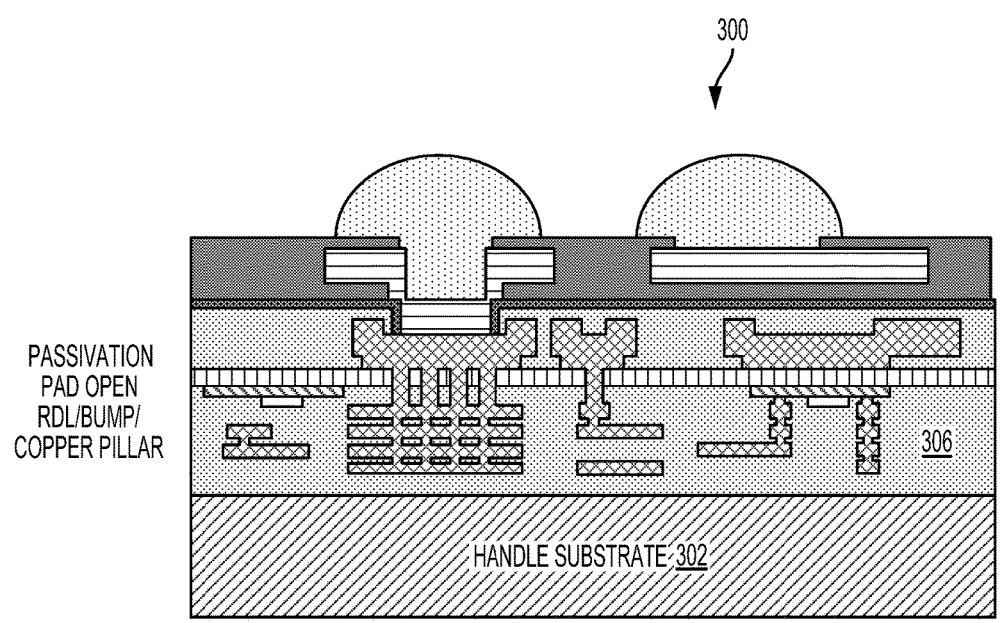

As shown in FIG. 3C, the RF SOI device is flipped once the handle substrate 302 is secured and the sacrificial substrate 301 is removed. As shown in FIG. 3D, a post-layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)). Referring again to FIG. 3A, the sacrificial substrate 301 may be removed, with a handle substrate attached such that a thickness of the BOX layer 320 may be increased to improve harmonics.

Figure 4:
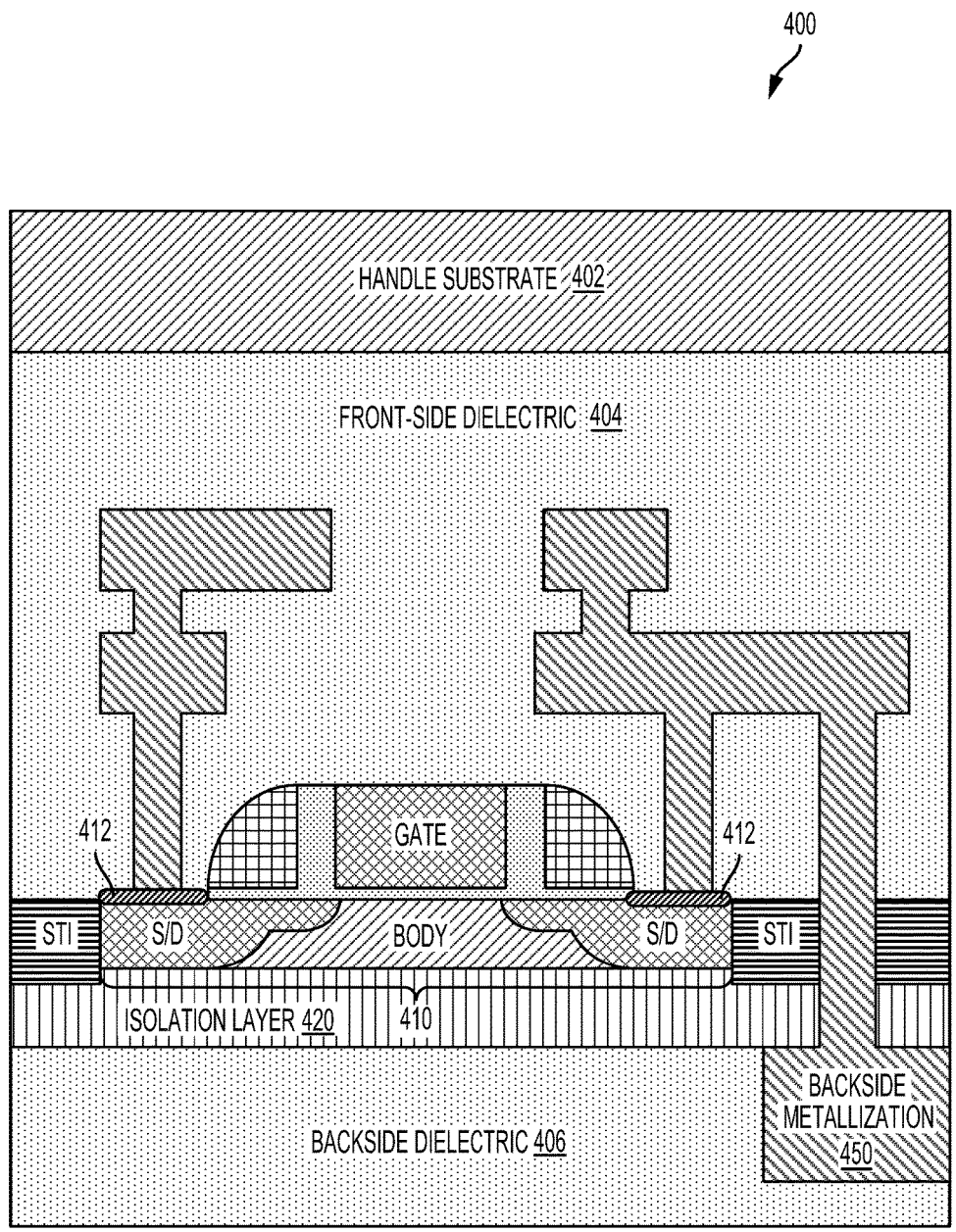
FIG. 4 is a cross-sectional view of an integrated radio frequency (RF) circuit structure fabricated using a layer transfer process according to aspects of the present disclosure.

FIG. 4 is a cross-sectional view of an integrated radio frequency (RF) circuit structure 400 fabricated using a layer transfer process according to aspects of the present disclosure. Representatively, the integrated RF circuit structure 400 includes an active device 410 having a gate, a body, and source/drain regions formed on an isolation layer 420. In silicon on insulator (SOI) implementations, the isolation layer 420 is a buried oxide (BOX) layer, and the body and source/drain regions are formed from an SOI layer including shallow trench isolation (STI) regions supported by the BOX layer.

The integrated RF circuit structure 400 also includes middle-end-of-line (MEOL)/back-end-of-line (BEOL) interconnects coupled to the source/drain regions of the active device 410. As described, the MEOL/BEOL layers are referred to as front-side layers. By contrast, the layers supporting the isolation layer 420 may be referred to as backside layers. According to this nomenclature, a front-side interconnect is coupled to the source/drain regions of the active device 410 through front-side contacts 412 in a front-side dielectric layer 404. In addition, a handle substrate 402 is coupled to the front-side dielectric layer 404. In this configuration, a backside dielectric 406 is adjacent to and possibly supports the isolation layer 420. In addition, a backside metallization 450 is coupled to the front-side interconnect.

Aspects of the present disclosure include a post-layer transfer process to enable formation of dual-sided, self-aligned transistors. Various aspects of the disclosure provide techniques for a post-layer transfer process to enable logic circuit block layouts with dual-sided processing for an integrated circuit structure.

Figure 5:
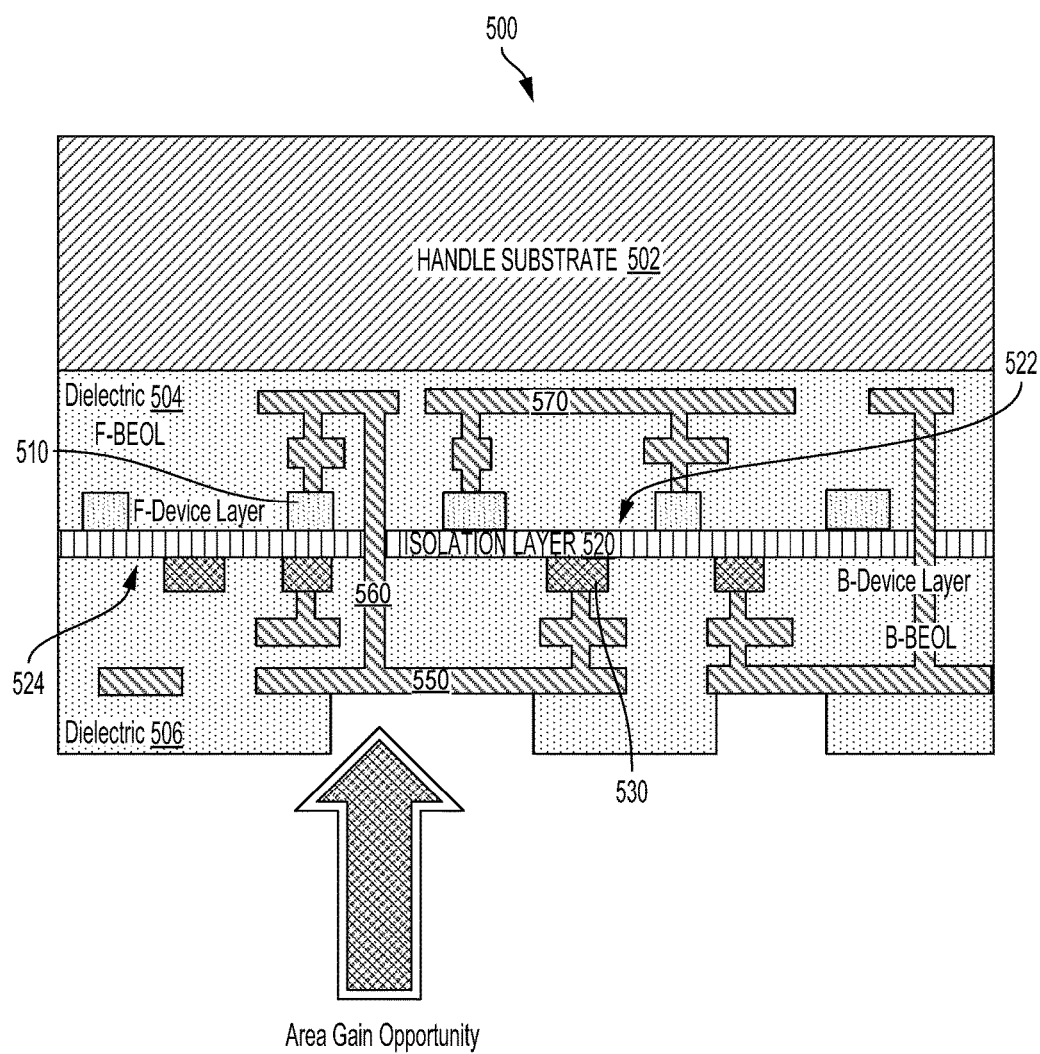
FIG. 5 is a cross-sectional view of an integrated circuit structure, including dual-sided, self-aligned active devices, according to aspects of the present disclosure.

FIG. 5 is a cross-sectional view of an integrated circuit structure 500, including dual-sided active devices (e.g., transistors), according to aspects of the present disclosure. In aspects of the present disclosure, a post-layer transfer process enables the formation of dual-sided transistors. Representatively, the integrated circuit structure 500 includes front-side transistors 510 formed on a front-side surface 522 of an isolation layer 520, which may be referred to as a front-side device layer (F-device layer). The isolation layer 520 may be a buried oxide (BOX) layer for a silicon on insulator (SOI) implementation, in which the body and source/drain regions are formed from an SOI layer. In some implementations, the isolation layer (e.g., the isolation layer 520) may be implemented with an insulation layer, an oxide layer, and/or the aforementioned BOX layer and may be differentiated from a substrate layer by material or thickness, as understood by persons or ordinary skill in the art.

In this configuration, the front-side transistors 510 are shown as NMOS transistors (e.g., planar transistors, FinFETs, gate all around nanowire, etc.). Configuring the front-side transistors 510 as the same type (n-type/p-type) simplifies the semiconductor fabrication process, such as the implant (or epitaxial growth) process for doping the n-type and p-type semiconductor regions as well as gate formation. It should be recognized that other active device configurations and polarity types are possible according to aspects of the present disclosure.

In this aspect of the present disclosure, the integrated circuit structure 500 also includes backside transistors 530 on a backside surface 524 opposite the front-side surface 522 of the isolation layer 520, which may be referred to as a backside device layer (B-device layer). In this configuration, the backside transistors 530 are shown as PMOS transistors. It should be recognized, however, that aspects of the present disclosure are applicable to planar transistors (e.g., CMOS planar transistors), FinFETs, gate-all-around nanowires, nanowires, and/or vertical transistors, and that other configurations of the front-side transistors 510 and the backside transistors 530 are also contemplated. In addition, a handle substrate 502 is coupled to a front-side dielectric layer 504.

According to aspects of the present disclosure, the handle substrate 502 may be composed of a semiconductor material, such as silicon. In this configuration, the handle substrate 502 may include at least one other active device. Alternatively, the handle substrate 502 may be a passive substrate to further improve harmonics by reducing parasitic capacitance. In this configuration, the handle substrate 502 may include at least one other passive device. As described, the term "passive substrate" may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

The integrated circuit structure 500 also includes a front-side metallization 570 (e.g., a first BEOL interconnects (M1)) in the front-side dielectric layer 504. The front-side metallization 570 is coupled to a backside metallization 550 through a via 560. The backside metallization 550 is in a backside dielectric layer 506. The backside dielectric layer 506 is adjacent to and possibly supports the isolation layer 520. In this configuration, a post-layer transfer metallization process forms the backside metallization 550. Accordingly, the integrated circuit structure 500 may include front-side MEOL/BEOL layers (F-MEOL/F-BEOL) that are formed on the front-side device layer and backside MEOL/BEOL layers (B-MEOL/B-BEOL) that are formed in the backside device layer.

The front-side metallization 570, the via 560 and the backside metallization 550 provide front-side to backside contacts for coupling the front-side transistors 510 and the backside transistors 530. The front-to-backside contacts are illustrated in more detail in FIGS. 6A and 6B.

Figure 6A:
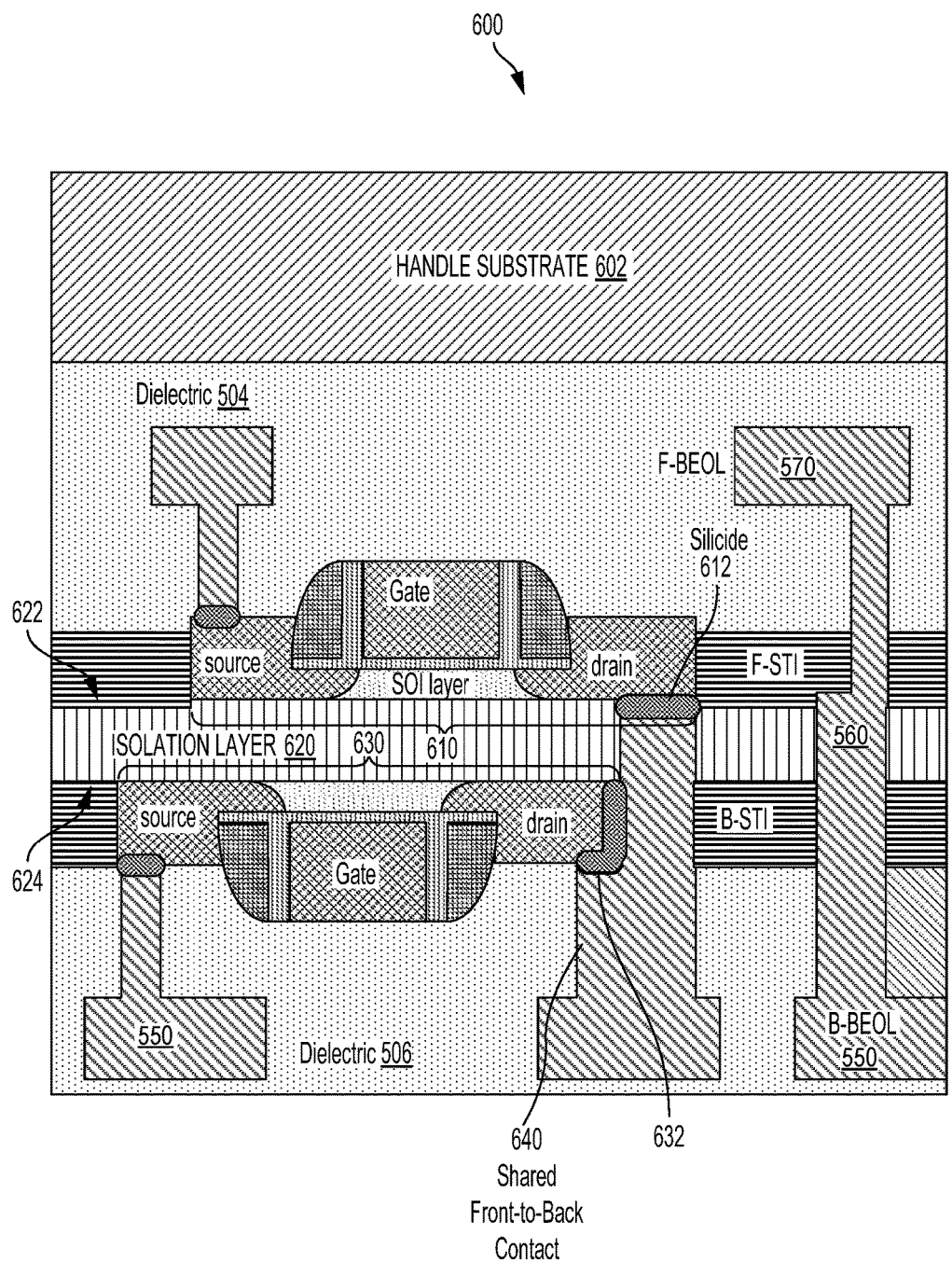
FIGS. 6A and 6B are cross-sectional views of an integrated circuit structure, including shared front-to-backside contacts for electrically coupling dual-sided, active devices, according to aspects of the present disclosure.

FIG. 6A is a cross-sectional view of an integrated circuit structure 600, including shared front-to-backside contacts 640 for electrically coupling dual-sided active devices (e.g., transistors), according to aspects of the present disclosure. In this arrangement, the shared contact 640 (e.g., the shared front-to-backside contact) electrically couples a drain region of a front-side transistor 610 and a drain region of a backside transistor 630 on a front-side surface 622 and a backside surface 624 of an isolation layer 620 (e.g., a buried oxide (BOX) layer). The integrated circuit structure 600 includes front-side shallow trench isolation (F-STI) regions formed on the front-side surface 622 of the isolation layer 620 and backside STI (B-STI) regions formed on the backside surface 624 of the isolation layer 620. The shared contact 640 may be fabricated by depositing a front-side contact material and/or a backside contact material (e.g., copper (Cu)) to electrically couple the source regions of the front-side transistor 610 and the backside transistor 630.

The front-side transistor 610 includes a gate, a body, and source/drain regions formed on the isolation layer 620. The backside transistor 630 also includes a gate, a body, and source/drain regions formed on the isolation layer 620. The front-side transistor 610 is on the front-side surface 622 of the isolation layer 620, and the backside transistor 630 is on the backside surface 624 of the isolation layer 620. In silicon on insulator (SOI) implementations, the isolation layer 620 is a buried oxide layer, and the body and source/drain regions are formed from an SOI layer including the front-side STI and backside STI that are arranged on the isolation layer 620.

The integrated circuit structure 600 also includes middle-end-of-line (MEOL)/back-end-of-line (BEOL) interconnects coupled to the source/drain regions of the front-side transistor 610 and the backside transistor 630. For example, the shared contact 640 (e.g., shared front-to-backside contact) is coupled to the source/drain regions of the front-side transistor 610 and the backside transistor 630 through a front-side contact 612 (e.g., a front-side silicide layer) and a backside contact 632 (e.g., a backside silicide layer). In this arrangement, the front-side transistor 610 is aligned with the backside transistor 630 in a staggered orientation. This staggered arrangement enables the shared contact 640 to electrically couple the backside contact 632, which is on a base portion and a side wall of the drain region of the backside transistor 630, to the front-side contact 612, which is on a backside of the drain region of the front-side transistor 610. In some implementations, the shared contact 640 may directly contact or touch a source or drain region of the front-side transistor 610 and a source or drain region of the backside transistor 630.

While the description is directed to connection of the drain region of the front-side transistor 610 and the drain region of the backside transistor 630, other connection configurations are possible. For example, the shared contact 640 may connect the source region of the front-side transistor 610 to the drain region of the backside transistor 630. The shared contact 640 may also electrically couple the gate of the front-side transistor 610 to the gate of the backside transistor 630. In this arrangement, the source region of the front-side transistor 610 is electrically coupled to a first voltage contact (e.g., a ground rail (Vss)), and the source region of the backside transistor 630 is electrically coupled to a second voltage contact (e.g., a power supply rail (Vdd)).

Figure 6B:
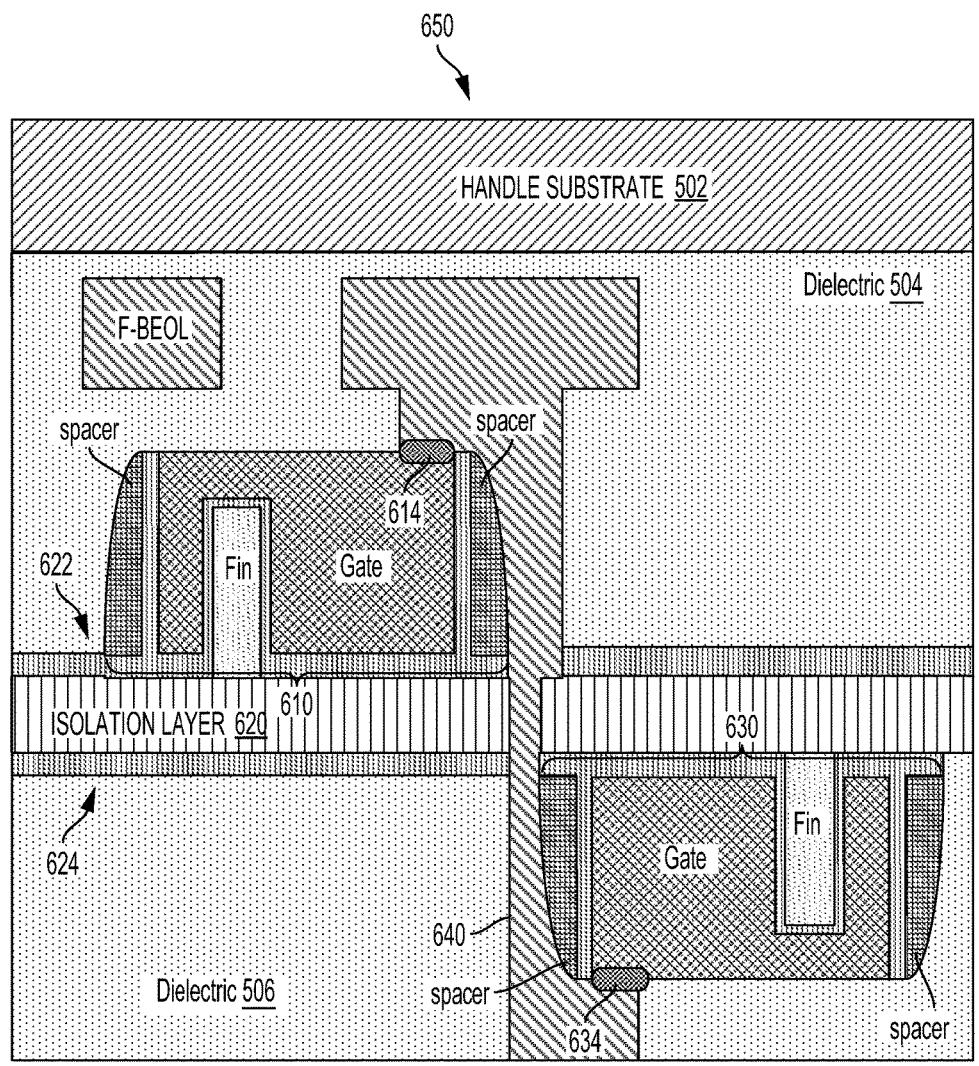

FIG. 6B is a cross-sectional view of an integrated circuit structure 650, including shared front-to-backside contacts 640 for electrically coupling dual-sided active devices (e.g., fin-type field effect transistors (FinFETs)), according to aspects of the present disclosure. In this arrangement, the shared contact 640 electrically couples a gate of a front-side transistor 610 to the gate of a backside transistor 630 on a front-side surface 622 and a backside surface 624 of an isolation layer 620 (e.g., a buried oxide (BOX) layer). The shared contact 640 is electrically coupled to the gate of the front-side transistor 610 through a front-side gate contact 614 (e.g., a front-side silicide layer). In addition, the shared contact 640 is electrically coupled to the gate of the backside transistor 630 through a backside gate contact 634 (e.g., a backside silicide layer). The shared contact 640 may be fabricated by depositing a front-side contact material and/or a backside contact material (e.g., copper (Cu)) to electrically couple the gates of the front-side transistor 610 and the backside transistor 630. Formation of the shared contact 640 is enabled by offsetting a front-side fin of the front-side transistor 610 from a backside fin of the backside transistor 630.

In aspects of the present disclosure, a post-layer transfer process forms dual-sided active devices that enable the formation of dual-sided, logic circuit block layouts, as shown in FIGS. 7A-7C, 8A and 8C. Having active devices on the front-side surface 622 and the backside surface 624 of the isolation layer 620 using dual-sided processing may enhance the performance provided by dual-sided block circuit layouts (e.g., by reducing lengths of signaling paths between the active devices). Further, the dual-sided, logic circuit block layouts may occupy a reduced die area (e.g., because more active devices may fit on two sides of a substrate than on one side of the substrate). Thus, in some examples, the dual-sided, logic gates may be suitable for use in electronic devices having small form factors (e.g., embedded devices, mobile communication devices, wearable devices, etc.)

FIGS. 7A-7C illustrate dual-sided, logic circuit block layouts of an integrated circuit device 700, according to aspects of the present disclosure. In a backside view 702 shown in FIG. 7A, a p-type metal oxide semiconductor (PMOS) transistor (e.g., B-PMOS) is supported by a backside of an isolation layer. For example, as shown in FIGS. 6A and 6B, the backside transistor 630 may be the B-PMOS transistors, supported by the backside surface 624 of the isolation layer 620. In a front-side view 704 as shown in FIG. 7B, an n-type metal oxide semiconductor (NMOS) transistor (e.g., F-NMOS) is supported by a front-side of the isolation layer, opposite the backside. For example, as shown in FIGS. 6A and 6B, the front-side transistor 610 may be the F-NMOS transistor, supported by the front-side surface 622 of the isolation layer 620.

FIGS. 7A and 7B also illustrate a first shared front-to-backside contact (Input) extending through the isolation layer and electrically coupling a gate of the B-PMOS transistor to the gate of the F-NMOS transistor. As shown in FIG. 6B, the first shared front-to-backside contact (Input) may be the shared contact 640 that is electrically coupled to the gate of the front-side transistor 610 through the front-side gate contact 614. In addition, the shared contact 640 is electrically coupled to the gate of the backside transistor 630 through a backside gate contact 634.

FIGS. 7A and 7B further illustrate a second shared contact (Output) extending through the isolation layer and electrically coupling a first terminal (e.g., a drain region) of the B-PMOS transistor to the first terminal (e.g., the drain region) of the F-NMOS transistor. For example, as shown in FIG. 6A, the shared contact 640 may connect the drain region of the front-side transistor 610 to the drain region of the backside transistor 630. As shown in FIG. 7A, a power supply rail (Vdd) is coupled to a second terminal (e.g., a source region) of the B-PMOS transistor. Similarly, in FIG. 7B, a ground rail (Vss) is coupled to the second terminal (e.g., a source region) of the F-NMOS transistor. For example, as shown in FIG. 6A, the source region of the front-side transistor 610 (F-NMOS) is electrically coupled to a ground rail (Vss). In addition, the source region of the backside transistor 630 (B-PMOS) is electrically coupled to the power supply rail (Vdd).

FIG. 7C is a combined view 706 of the integrated circuit device 700, according to aspects of the present disclosure, as viewed from the backside of the integrated circuit structure. The dual-sided, logic gate of the integrated circuit device 700 is configured as an inverter as seen in the schematic diagram of the inverter shown in FIG. 7D. This aspect of the present disclosure solves the problem of reduced circuit density associated with conventional CMOS fabrication processes by providing dual-sided, logic circuit block layouts using a post-layer transfer process.

Figure 8A:
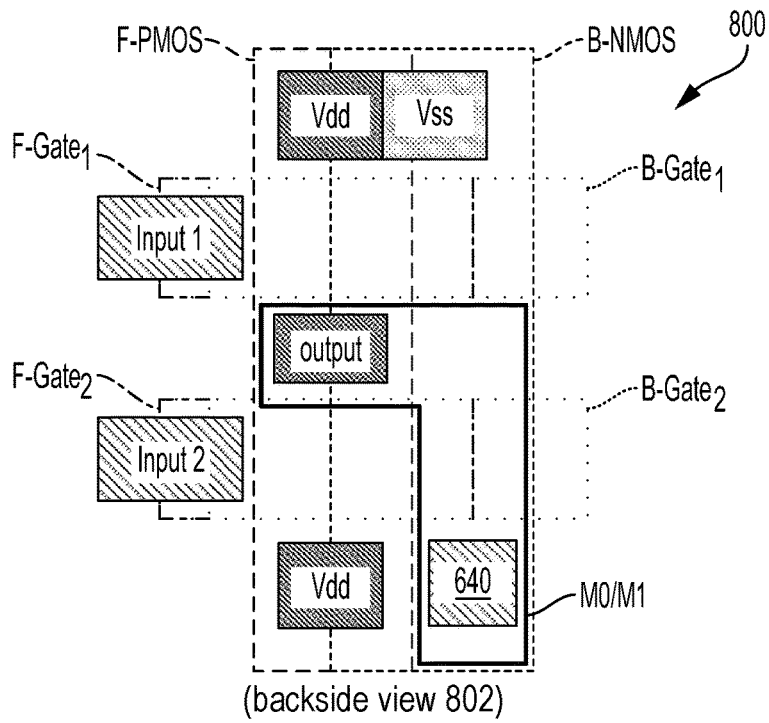
FIG. 8A illustrates a negative AND (NAND) logic gate layout, according to aspects of the present disclosure.
Figure 8B:
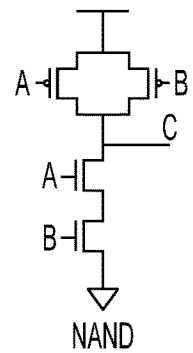
FIG. 8B illustrates a circuit representation of the negative AND (NAND) logic shown in FIG. 8A according to aspects of the present disclosure.
Figure 8C:
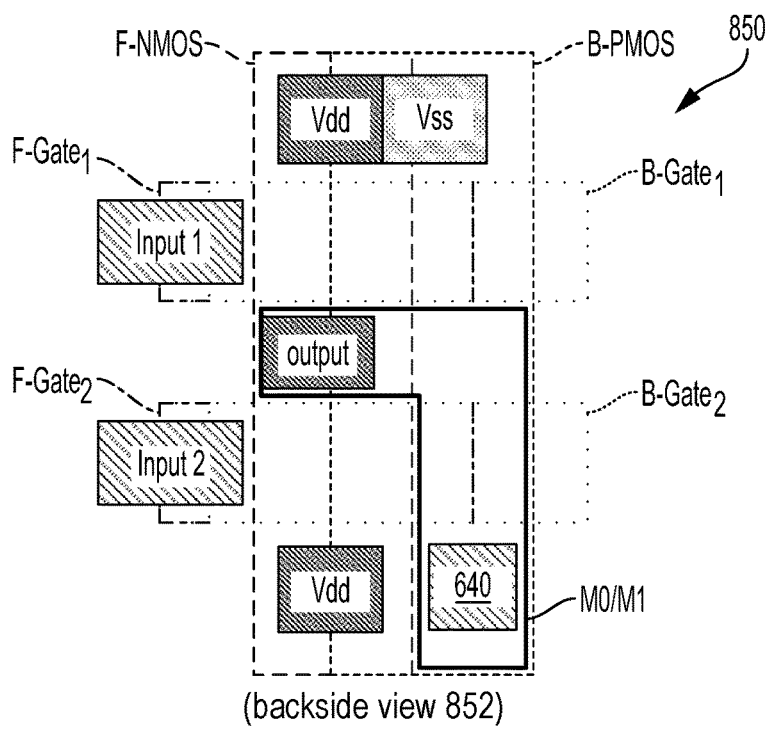
FIG. 8C illustrates a negative OR (NOR) logic gate layout, according to aspects of the present disclosure.

The integrated circuit device 700 may be configured to provide other logic circuits, such as a negative AND (NAND) logic or a negative OR (NOR) logic, shown in FIGS. 8A and 8C, respectively.

FIG. 8A illustrates an integrated circuit device 800, having a dual-sided, negative AND (NAND) logic circuit block layout based on a NAND logic gate schematic shown in FIG. 8B, according to aspects of the present disclosure. In the backside view 802 shown in FIG. 8A, a pair of first polarity (e.g. PMOS) transistors are on a front-side (F) of an isolation layer, which are shown as F-PMOS transistors. The pair of F-PMOS transistors is electrically coupled in parallel. The integrated circuit device 800 also includes a pair of second polarity (NMOS) transistors on a backside (B) of the isolation layer, opposite the front-side, which are shown as B-NMOS transistors. The pair of B-NMOS transistors is electrically coupled in series. The integrated circuit device 800 further includes a first shared contact (Input 1) coupled to a gate (F-Gate$_1$) of a first transistor of the F-PMOS transistors and a gate (B-Gate$_1$) of the first transistor of the pair of B-NMOS transistors. In addition, a second shared contact (Input 2) is coupled to a gate (F-Gate$_2$) of a second transistor of the pair of F-PMOS transistors and a gate (B-Gate$_2$) of the second transistor of the pair of B-NMOS transistors.

As further illustrated in FIG. 8A, the integrated circuit device 800 also includes a supply voltage rail (Vdd) coupled to a first terminal (e.g., a source region) of each of the pair of F-PMOS transistors. In addition, a ground rail (Vss) is coupled to the first terminal (e.g., a source region) of one of the pair of B-NMOS transistors. The integrated circuit device 800 further includes an output contact coupled to a second terminal (e.g., a drain region) of the other of the pair of B-NMOS transistors. The output contact is also coupled to the second terminal (e.g., the drain region) of both of the pair of F-PMOS transistors. In this arrangement, the electrical coupling of the output contact is provided by the shared contact 640 and the interconnect layer (metal zero (M0) or metal one (M1) (M0/M1)).

Figure 8D:
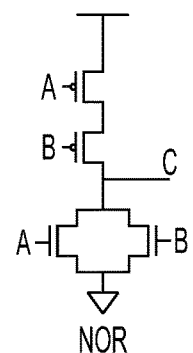
FIG. 8D illustrates a circuit representation of the negative OR (NOR) logic gate shown in FIG. 8C according to aspects of the present disclosure.

FIG. 8C illustrates an integrated circuit device 850, having a dual-sided, negative OR (NOR) logic circuit block layout based on a NOR logic gate schematic shown in FIG. 8D, according to aspects of the present disclosure. As will be recognized, a configuration of the integrated circuit device 850 is similar to the configuration of the integrated circuit device 800 of FIG. 8A. In the backside view 852 shown in FIG. 8C, however, the polarities are switched, such that the first polarity is NMOS and the second polarity is PMOS. Representatively, a pair of NMOS transistors is on the front-side (F) of an isolation layer, which is shown as F-NMOS transistors, electrically coupled in parallel. The integrated circuit device 850 also includes a pair of PMOS transistors on the backside (B) of the isolation layer, which are shown as B-PMOS transistors, electrically coupled in series. The first shared contact (Input 1) is also coupled to the F-Gate$_1$ of a first transistor of the F-NMOS transistors and the B-Gate$_1$ of the first transistor of the pair of B-PMOS transistors. In addition, the second shared contact (Input 2) is coupled to the F-Gate$_2$ of a second transistor of the pair F-NMOS transistors and the B-Gate$_2$ of the second transistor of the pair of B-PMOS transistors.

As further illustrated in FIG. 8C, the integrated circuit device 800 includes a supply voltage rail (Vdd) coupled to a first terminal (e.g., the source region) of each of the pair of F-NMOS transistors. In addition, the ground rail (Vss) is coupled to the first terminal (e.g., the source region) of one of the pair of B-PMOS transistors. The integrated circuit device 800 further includes an output contact coupled to the second terminal (e.g., the drain region) of the other of the pair of B-PMOS transistors. The output contact is also coupled to the second terminal (e.g., the drain region) of both of the pair of F-NMOS transistors. In this arrangement, the electrical coupling of the output contact is enabled by the shared contact 640 and the interconnect layer M0/M1.

As will be recognized, a configuration of the integrated circuit structure (e.g., 700/800/850) may provide various logic circuit block layouts, and is not limited to the dual-sided inverter logic gate (FIG. 7B), the dual-sided NAND logic gate (FIG. 8A) or the dual-sided NOR logic gate (FIG. 8C). In particular, aspects of the present disclosure contemplate the use of dual-sided processing to fabricate dual-sided, logic gates suitable for use in electronic devices having small form factors (e.g., embedded devices, mobile communication devices, wearable devices, etc.)

Figure 9:
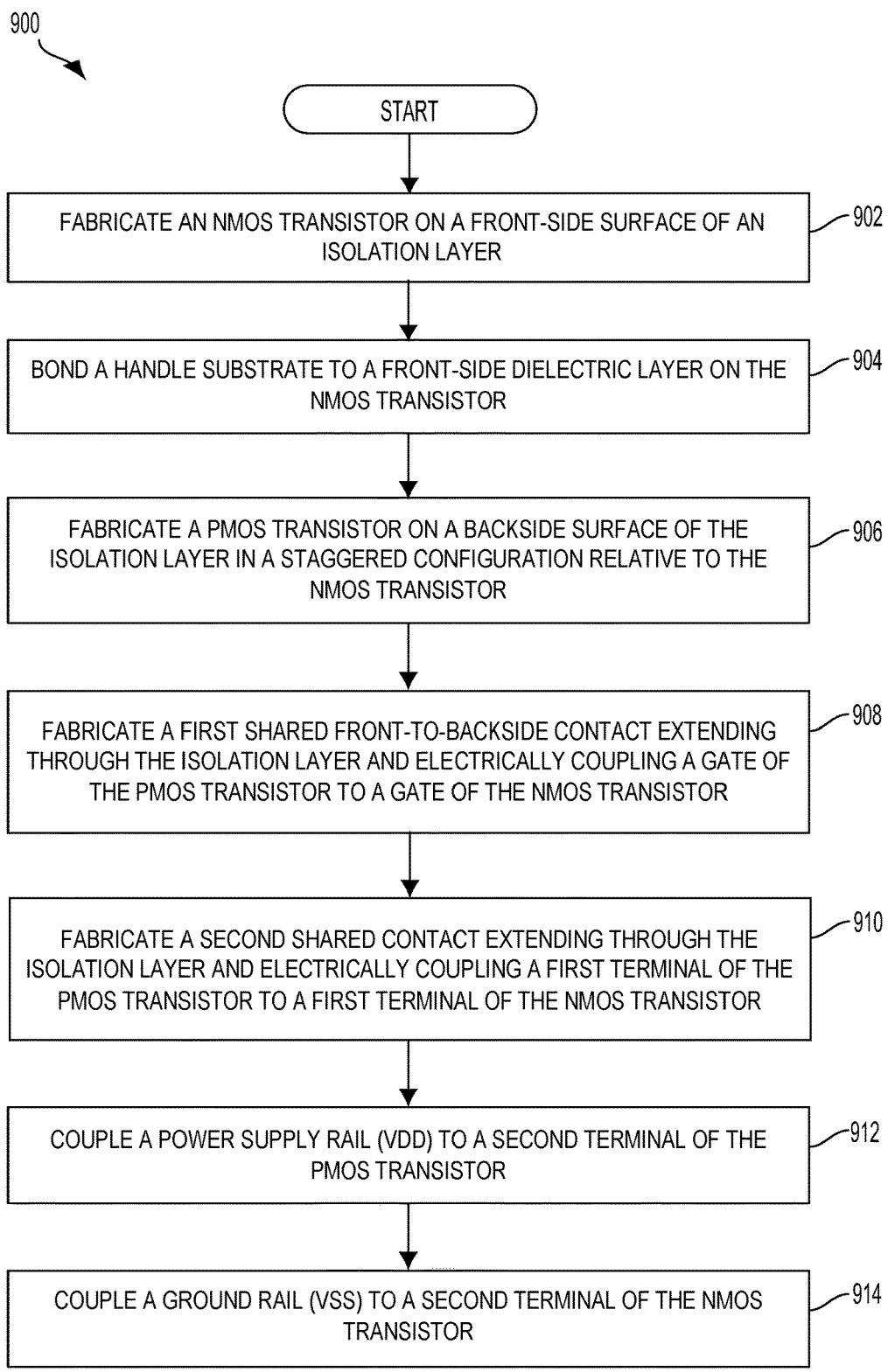
FIG. 9 is a process flow diagram illustrating a method of constructing an integrated circuit including dual-sided, self-aligned transistors, according to an aspect of the present disclosure.

FIG. 9 is a process flow diagram illustrating a method 900 of constructing an integrated circuit device, according to an aspect of the present disclosure. In block 902, an n-type metal oxide semiconductor (NMOS) transistor is fabricated on a front-side surface of an isolation layer. For example, as shown FIG. 7A, the NMOS transistor may be the front-side transistor 610, on the front-side surface 622 of the isolation layer 620. Referring again to FIG. 9, at block 904, a handle substrate is bonded to a front-side dielectric layer on the NMOS transistor. For example, a layer transfer process is performed, in which a handle substrate 502 is bonded to a front-side dielectric layer 504, as shown in FIG. 5. The layer transfer process also includes removal of a portion of a bulk substrate (not shown). As shown in FIG. 3B, the layer transfer process includes removal of the sacrificial substrate 301. In this aspect of the present disclosure, fabrication of backside transistors is performed as part of a post-layer transfer process.

Referring again to FIG. 9, in block 906, a p-type metal oxide semiconductor (PMOS) transistor is fabricated on the backside surface of the isolation layer in a staggered configuration relative to the NMOS transistor. For example, as shown in FIG. 7A, the PMOS transistor may be the backside transistor 630, on the backside surface 624 of the isolation layer 620 according to a post-layer transfer backside formation process. At block 908, a first shared front-to-backside contact extending through the isolation layer and electrically coupling a gate of the PMOS transistor to the gate of the NMOS transistor is fabricated. For example, as shown in FIG. 6B, the first shared front-to-backside contact (Input) may be the shared contact 640 that is electrically coupled to the gate of the front-side transistor 610 through the front-side gate contact 614. In addition, the shared contact 640 is electrically coupled to the gate of the backside transistor 630 through a backside gate contact 634.

As further illustrated in FIG. 9, at block 910, a second shared contact extending through the isolation layer and electrically coupling a first terminal of the PMOS transistor to the first terminal of the NMOS transistor is fabricated. For example, as shown in FIG. 6A, the shared contact 640 may connect the drain region of the front-side transistor 610 (NMOS) to the drain region of the backside transistor 630 (PMOS). At block 912, a power supply rail (Vdd) is electrically coupled to a second terminal of the PMOS transistor. At block 914, a ground rail (Vss) is electrically coupled to the second terminal of the NMOS transistor. For example, as shown in FIG. 6A, the source region of the front-side transistor 610 (NMOS) is electrically coupled to a ground rail (Vss). In addition, the source region of the backside transistor 630 (PMOS) is electrically coupled to the power supply rail (Vdd).

Aspects of the present disclosure relate to dual-sided, logic circuit block layouts that may be used in integrated radio frequency (RF) circuit structures for high quality (Q)-factor RF applications. The dual-sided processing enables formation of dual-sided, logic gates, resulting in up to 60% area savings. In one configuration, a pre-layer transfer process forms front-side transistors. In addition, a post-layer transfer process forms backside transistors. The post-layer transfer process may also form fin-type field effect transistors (FinFETs). Having active devices on the front-side surface and the backside surface of the isolation layer using dual-sided processing may enhance the performance provided by dual-sided block circuit layouts (e.g., by reducing lengths of signaling paths between the active devices). Thus, in some examples, the dual-sided, logic gates may be suitable for use in electronic devices having small form factors (e.g., embedded devices, mobile communication devices, wearable devices, etc.)

Figure 10:
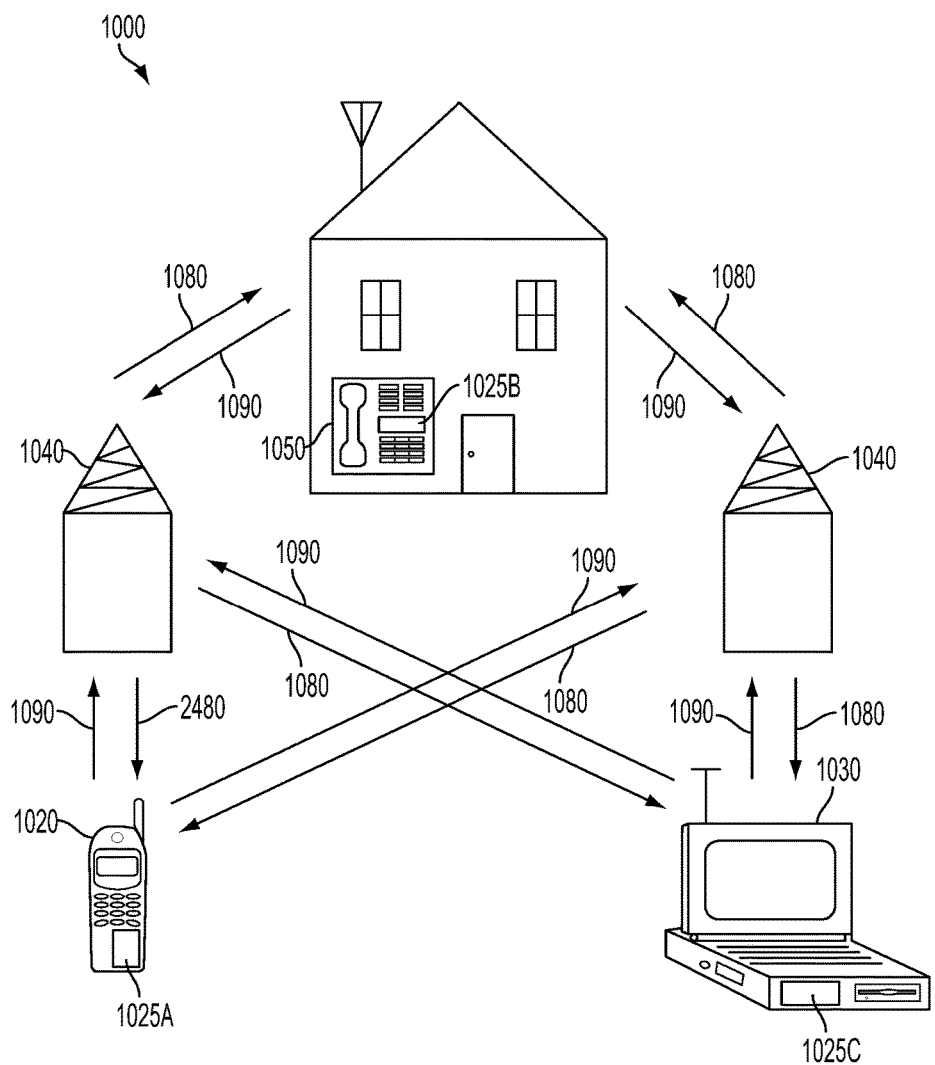
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed dual-sided, logic gates. It will be recognized that other devices may also include the disclosed dual-sided, logic gates, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed dual-sided, logic gates.

Figure 11:
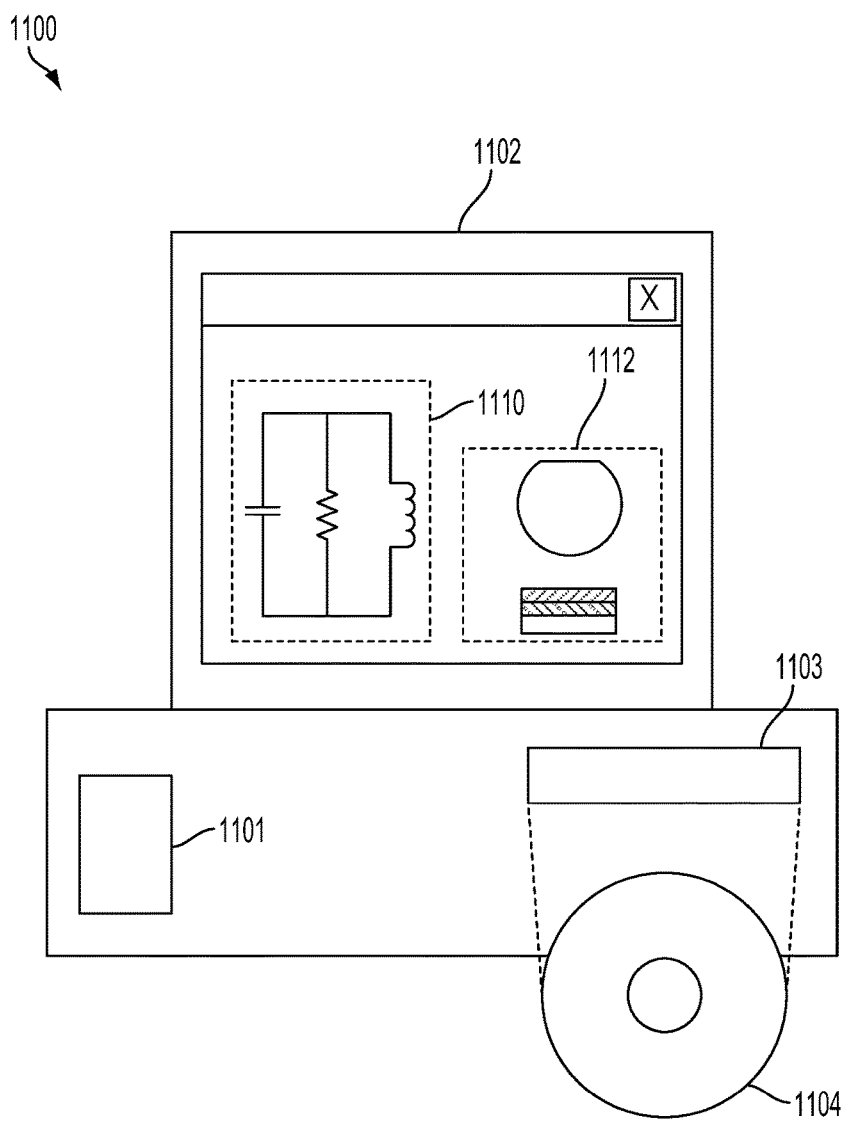
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the dual-sided, logic gates disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a dual-sided, logic gates. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit device, comprising:
a p-type metal oxide semiconductor (PMOS) transistor having a body and source/drain regions supported by a backside of an isolation layer;
an n-type metal oxide semiconductor (NMOS) transistor having a body and source/drain regions supported by a front-side of the isolation layer, opposite the backside, in which the body and source/drain regions of the NMOS transistor are separated from the body and the source/drain regions of the PMOS transistor by the isolation layer; and
a shared contact extending through the isolation layer and electrically coupling a first terminal of the PMOS transistor to a first terminal of the NMOS transistor, the shared contact comprising:
a first shared front-to-backside contact extending through the isolation layer and electrically coupling a gate of the PMOS transistor to a gate of the NMOS transistor, and
a second shared front-to-backside contact extending through the isolation layer and electrically coupling the first terminal of the PMOS transistor to the first terminal of the NMOS transistor.

2. The integrated circuit device of claim 1, further comprising:
a power supply rail (Vdd) coupled to a second terminal of the PMOS transistor; and
a ground rail (Vss) coupled to the second terminal of the NMOS transistor, in which the integrated circuit device comprises an inverter gate, having the first shared front-to-backside contact as an input and the second shared contact as an output.

3. The integrated circuit device of claim 1, in which the PMOS transistor and the NMOS transistor comprise fin-type field effect transistors (FinFETs), in which a front-side fin of the NMOS transistor is offset from a backside fin of the PMOS transistor, and the first shared front-to-backside contact touches a sidewall spacer of the PMOS transistor and a sidewall spacer of the NMOS transistor.

4. The integrated circuit device of claim 1, in which the NMOS transistor and the PMOS transistor comprise gate-all-around nanowires, nanowires, or vertical transistors.

5. The integrated circuit device of claim 1, in which the PMOS transistor and the NMOS transistor comprise planar transistors, in which a gate of the PMOS transistor is offset from the gate of the NMOS transistor according to a staggered arrangement.

6. The integrated circuit device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

7. An integrated circuit device, comprising:
a pair of first polarity transistors having body and source/drain regions on a front-side of an isolation layer, the pair of first polarity transistors electrically coupled in parallel;
a pair of second polarity transistors having body and source/drain regions on a backside of the isolation layer, opposite the front-side, the pair of second polarity transistors electrically coupled in series, in which the body and source/drain regions of the pair of first polarity transistors are separated from the body and source/drain regions of the pair of second polarity transistors by the isolation layer;
a first shared contact coupled to a gate of the first transistor of the pair of first polarity transistors and a gate of the first transistor of the pair of second polarity transistors;
a second shared contact coupled to a gate of the second transistor of the pair of first polarity transistors and a gate of the second transistor of the pair of second polarity transistors;
a first voltage contact coupled to a first terminal of each of the pair of first polarity transistors;
a second voltage contact coupled to a first terminal of one of the pair of second polarity transistors; and
an output contact coupled to a second terminal of the other pair of second polarity transistors and also coupled to a second terminal of both of the pair of first polarity transistors.

8. The integrated circuit device of claim 7, in which the integrated circuit device comprises a dual-sided negative AND (NAND) logic gate, the pair of first polarity transistors comprise p-type metal oxide semiconductor (PMOS) transistors, the pair of second polarity transistors comprise n-type metal oxide semiconductor (NMOS) transistors, the first voltage contact comprises a power supply rail (Vdd), and the second voltage contact comprises a ground rail (Vss).

9. The integrated circuit device of claim 7, in which the integrated circuit device comprises a dual-sided, negative OR (NOR) logic gate, the pair of first polarity transistors comprise n-type metal oxide semiconductor (NMOS) transistors, the first voltage contact comprises a ground rail (Vss), and the second voltage contact comprises a power supply rail (Vdd).

10. The integrated circuit device of claim 7, in which the pair of first polarity transistors and the pair of second polarity transistors comprise fin-type field effect transistors (FinFETs) and the first shared contact touches a sidewall spacer of the first transistor of the pair of first polarity transistors and a sidewall spacer of the first transistor of the pair of second polarity transistors.

11. The integrated circuit device of claim 7, in which the pair of first polarity transistors and the pair of second polarity transistors comprise gate-all-around nanowires, nanowires, or vertical transistors.

12. The integrated circuit device of claim 7, in which the pair of first polarity transistors and the pair of second polarity transistors comprise planar transistors.

13. The integrated circuit device of claim 7, further comprising a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

14. A radio frequency (RF) front end module, comprising:
an integrated RF circuit structure, comprising a p-type metal oxide semiconductor (PMOS) transistor having a body and source/drain regions supported by a backside of an isolation layer, an n-type metal oxide semiconductor (NMOS) transistor having a body and source/drain regions supported by a front-side of the isolation layer, in which the body and source/drain regions of the NMOS transistor are separated from the body and source/drain regions of the PMOS transistor by the isolation layer, and a shared contact extending through the isolation layer and electrically coupling a first terminal of the PMOS transistor to a first terminal of the NMOS transistor, the shared contact comprising:
- a first shared front-to-backside contact extending through the isolation layer and electrically coupling a gate of the PMOS transistor to a gate of the NMOS transistor, and
- a second shared front-to-backside contact extending through the isolation layer and electrically coupling the first terminal of the PMOS transistor to the first terminal of the NMOS transistor; and an antenna coupled to an output of the integrated RF circuit structure.

15. The RF front end module of claim 14, further comprising:
- a power supply rail (Vdd) coupled to a second terminal of the PMOS transistor; and
- a ground rail (Vss) coupled to the second terminal of the NMOS transistor, in which the integrated RF circuit structure comprises an inverter gate, having the first shared front-to-backside contact as an input and the second shared contact as the output.

16. The RF front end module of claim 14, incorporated into at least one of a music player, a video player, an entertainment unit, a navigation device, a communications device, a personal digital assistant (PDA), a fixed location data unit, a mobile phone, and a portable computer.

* * * * *